(12) United States Patent
Suzumura et al.

(10) Patent No.: US 10,283,644 B2
(45) Date of Patent: *May 7, 2019

(54) THIN FILM TRANSISTOR HAVING STABLE THRESHOLD VOLTAGE AND LESS PARASITIC CAPACITANCE, AND DISPLAY DEVICE USING THE SAME

(71) Applicant: Japan Display Inc., Tokyo (JP)

(72) Inventors: Isao Suzumura, Tokyo (JP); Norihiro Uemura, Tokyo (JP); Takeshi Noda, Tokyo (JP); Hidekazu Miyake, Tokyo (JP); Yohei Yamaguchi, Tokyo (JP)

(73) Assignee: Japan Display Inc., Tokyo (JP)

( * ) Notice: Subject to any disclaimer, the term of this patent is extended or adjusted under 35 U.S.C. 154(b) by 242 days.

This patent is subject to a terminal disclaimer.

(21) Appl. No.: 15/172,576

(22) Filed: Jun. 3, 2016

(65) Prior Publication Data

US 2016/0284867 A1  Sep. 29, 2016

Related U.S. Application Data

(63) Continuation of application No. 14/245,102, filed on Apr. 4, 2014, now Pat. No. 9,391,213.

(30) Foreign Application Priority Data

Apr. 11, 2013 (JP) .................. 2013-083282

(51) Int. Cl.
*G02F 1/1335* (2006.01)
*H01L 29/786* (2006.01)
*H01L 27/12* (2006.01)
*G02F 1/1333* (2006.01)
(Continued)

(52) U.S. Cl.
CPC ...... *H01L 29/78696* (2013.01); *G02F 1/1337* (2013.01); *G02F 1/1368* (2013.01);
(Continued)

(58) Field of Classification Search
CPC .......... H01L 29/7869; H01L 29/78696; H01L 21/02554; H01L 29/4908; H01L 29/786;
(Continued)

(56) References Cited

U.S. PATENT DOCUMENTS 8,692,252 B2 * 4/2014 Takata .............. H01L 29/78696
257/43
9,419,146 B2 * 8/2016 Yamazaki ......... H01L 29/78693
(Continued)

FOREIGN PATENT DOCUMENTS

JP 2010-16126 A 1/2010
JP 2010-56540 A 3/2010
(Continued)

OTHER PUBLICATIONS

Ichikawa, Takenori; Notification of Reasons for Refusal, issued in Japanese Patent Application No. 2013-083282; dated Jan. 26, 2017; 7 pages, including English translation.

*Primary Examiner* — Huyen Ngo
(74) *Attorney, Agent, or Firm* — Ulmer & Berne LLP

(57) ABSTRACT

A thin film transistor includes a first oxide semiconductor, a source electrode, a drain electrode, a gate insulating film and a gate electrode. A second oxide semiconductor layer is between the first oxide semiconductor layer and the source electrode. A third oxide semiconductor layer is between the first oxide semiconductor layer and the drain electrode. The content ratio of oxygen/Indium in each of the second semiconductor layer and the third oxide semiconductor layer is equal to or larger than that of the first semiconductor layer. A thickness of each of the second semiconductor layer and the third oxide semiconductor layer is bigger than that of the first semiconductor layer.

8 Claims, 10 Drawing Sheets

(51) Int. Cl.
  *G02F 1/1337* (2006.01)
  *G02F 1/1343* (2006.01)
  *G02F 1/1368* (2006.01)
  *H01L 29/24* (2006.01)

(52) U.S. Cl.
  CPC .. *G02F 1/133345* (2013.01); *G02F 1/133512* (2013.01); *G02F 1/133514* (2013.01); *G02F 1/134309* (2013.01); *H01L 27/1225* (2013.01); *H01L 27/1285* (2013.01); *H01L 29/24* (2013.01); *H01L 29/7869* (2013.01); *H01L 29/78606* (2013.01); *H01L 29/78618* (2013.01); *H01L 29/78633* (2013.01); *H01L 29/78693* (2013.01); *G02F 2001/133357* (2013.01)

(58) Field of Classification Search
  CPC ............ H01L 27/3258; H01L 27/3272; H01L 51/0562; C23C 14/086; C04B 2235/3286
  See application file for complete search history.

(56) References Cited

U.S. PATENT DOCUMENTS

| | | |
|---|---|---|
| 2010/0025676 A1 | 2/2010 | Yamazaki et al. |
| 2010/0059747 A1 | 3/2010 | Nakayama et al. |
| 2010/0148168 A1* | 6/2010 | Lai .................... H01L 27/1225 257/43 |
| 2010/0200843 A1* | 8/2010 | Arai ................... H01L 27/3262 257/40 |
| 2010/0283049 A1* | 11/2010 | Sato .................. H01L 29/78606 257/43 |
| 2010/0301326 A1 | 12/2010 | Miyairi et al. |
| 2011/0180793 A1 | 7/2011 | Taniguchi |
| 2011/0240998 A1* | 10/2011 | Morosawa ........ H01L 29/41733 257/57 |
| 2012/0228623 A1* | 9/2012 | Terai .................. H01L 27/1244 257/72 |
| 2012/0241744 A1 | 9/2012 | Tokunaga |
| 2012/0313509 A1* | 12/2012 | Takagi .................. H05B 33/10 313/504 |
| 2013/0009111 A1* | 1/2013 | Morita ............. H01L 21/02554 252/519.1 |
| 2013/0033655 A1 | 2/2013 | Miyamoto |
| 2013/0134417 A1 | 5/2013 | Yamazaki et al. |

FOREIGN PATENT DOCUMENTS

| | | |
|---|---|---|
| JP | 2010-67849 A | 3/2010 |
| JP | 2011-155061 A | 8/2011 |
| JP | 2012-204548 A | 10/2012 |

\* cited by examiner

F I G . 1
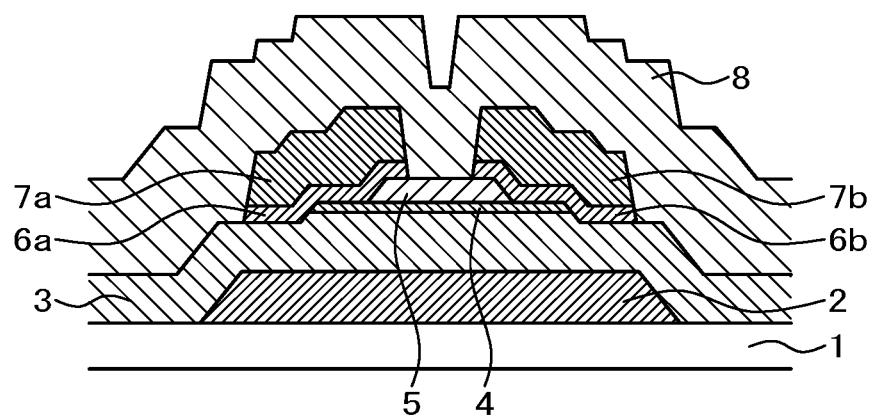

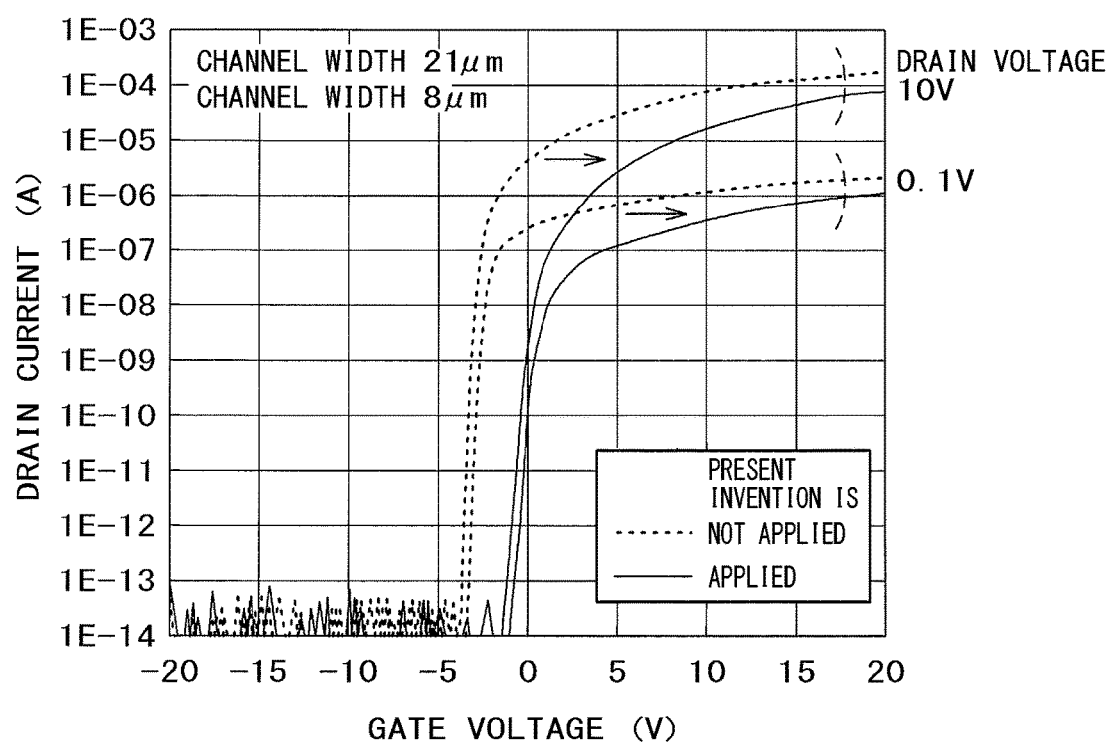

THIN FILM TRANSISTOR HAVING STABLE THRESHOLD VOLTAGE AND LESS PARASITIC CAPACITANCE, AND DISPLAY DEVICE USING THE SAME

CROSS-REFERENCE TO RELATED APPLICATIONS

The present application is a continuation of U.S. patent application Ser. No. 14/245,102 filed on Apr. 4, 2014, which claims priority of Japanese Patent Application JP 2013-083282 filed on Apr. 11, 2013. The entire disclosures of each of these applications are hereby incorporated herein by reference.

FIELD OF THE INVENTION

The present invention relates to a thin film transistor using an oxide semiconductor as a channel layer, and also a display device using the same.

BACKGROUND OF THE INVENTION

In display devices, there are arranged a TFT substrate and an opposite substrate. The TFT substrate has pixels which are formed in matrix and each of which has a pixel electrode and a thin film transistor (TFT). The opposite substrate is opposed to the TFT substrate, and has a color filter or the like in a position corresponding to the pixel electrode of the TFT substrate. In liquid crystal display devices, liquid crystal is sandwiched between the TFT substrate and the opposite substrate. Light transmittance by liquid crystal molecules is controlled in association with each pixel, thereby forming images.

In recent years, along with the rapid diffusion of Smart Phones (registered trademark) or tablet devices, there are high demands for high refinement, power consumption reduction, and cost reduction in the liquid crystal display (LCD) applied thereinto. To meet the demands, the development of oxide TFTs has been activated as TFT substrates in the LCD, using TAOS (Transparent Amorphous Oxide Semiconductors), particularly, IGZO (Indium Gallium Zinc Oxide) film as a channel layer (Japanese Unexamined Patent Application Publication No 2010-67849). Note that the TAOS has a higher mobility than amorphous Si (a-Si).

An object of Japanese Unexamined Patent Application Publication No 2010-67849 is to provide a thin film field effect transistor having a high mobility and a high ON/OFF ratio and also a display device using the transistor. As illustrated in FIG. 12, as one example, there is disclosed a thin film field effect transistor which has at least an insulating layer 502, a gate electrode 503, a gate insulating film 504, an activate layer 505, a source electrode 507-1, and a drain electrode 507-2, on a substrate 501. The active layer 505 is an oxide semiconductor layer. A resistive layer 506 formed of an oxide semiconductor layer is provided between the activate layer 505 and at least one of the source electrode 507-1 and the drain electrode 507-2. The electric conductivity of the active layer 505 is $10^{-4}$ Scm$^{-1}$ or greater but less than $10^2$ Scm$^{-1}$. The ratio of the electric conductivity of the active layer 505 to the electric conductivity of the resistive layer 506 (electric conductivity of the active layer/electric conductivity of the resistive layer) is $10^1$ or greater or $10^{10}$ or below. One side of at least one of the source electrode and the drain electrode in contact with the resistive layer 506 is Ti or a Ti alloy layer. A reference numeral 510 denotes an overlapped region of the gate electrode with the source electrode or the drain electrode.

Because oxide semiconductors have a higher mobility than a-Si, it is estimated that they will take the place of a-Si from this time on. The inventors have examined the oxide semiconductors in detail. From the findings, (1) the electron field-effect mobility in the amorphous Si (a-Si) TFT is very low, that is, up to 1 cm$^2$/Vs. If the TFT size is reduced, insufficient writing to pixels occurs. It is difficult to reduce the TFT size for high refinement. For example, in the IGZO-TFT, the electron field-effect mobility is large, that is, up to 10 cm$^2$/Vs. Thus, even in a small-sized TFT, the wiring into the pixels is performed in safe, thus enabling to improve the refinement. (2) A leakage current occurs, even a gate voltage is OFF, in the conventional low-temperature polysilicon TFT (LTPS-TFT) or a-Si TFT. At this time, holding of a pixel voltage is the subject matter to be solved, when the TFT is not selected. The off-leak current is lower in the IGZO-TFT than in the LTPS-TFT by three digits, and lower than in the a-Si TFT by two digits. Therefore, a holding voltage of the pixel is easily reduced.

(i) The IGZO film is weak against hydrogen, and hydrogen deficiency easily occurs. There is a concern about the long-term stability. (ii) If a gate negative stress is applied to the IGZO-TFT under light emission, a threshold value voltage (Vth) easily shifts along with the applied time of the stress. The Vth shift has a negative influence on the operation or display of the panel. (iii) Due to the problem of the Vth shift, the IGZO film is shielded from backlight. Thus, a gate shielding structure is often applied into the TFT with a bottom gate structure (inversely-staggered type). However, in this structure, parasitic capacitances (Cgd, Cgd) increase between the gate electrode and the source/drain electrode. This easily results in some problems. That is, the punch-through voltage of the pixel increases so as to generate a flicker on the panel display, and the driving performance of the peripheral circuit decreases.

For the above-described problems (ii) and (iii), to reduce the parasitic capacitances Cgs and Csd of the bottom gate TFT having the gate electrode shielding structure, it is preferred to reduce overlapped regions (regions denoted by the reference numeral 510 of FIG. 12) of the gate electrode and the source/drain electrode. However, in fact, this is very difficult in view of light diffusion or the manufacturing margin. Thus, in a realistic method, the film thickness of the IGZO is increased, and the distance between the gate electrode and the source/drain electrode is increased in a longitudinal direction. Based on a consideration of the above-described problem (i), it is effective to cover the oxide semiconductor layer as a channel layer with a channel protection film.

In FIG. 12, an original oxide TFT has been manufactured. In this TFT, the channel layer (active layer) 505 is made thick, and a channel protection layer is provided between the channel layer 505 and the resistive layer 506. However, it is ascertained that, in this oxide TFT, the initial Vth is easily depleted. Based on the inventors' examination results, in the TFT having the channel protection layer, oxygen deficiency easily occurs on the back channel side of the IGZO film, due to the damage at the film formation of the channel protection layer using plasma CVD. After escape of oxygen, a surplus of electrons behaves as carriers. In the IGZO-TFT, it is estimated that an initial threshold value voltage (Vth) is easily depleted. As a result of the Vth depletion, the operation of the peripheral circuit is difficult, if there is any peripheral circuit incorporated in the panel. As a result of further examination, it is effective that the IGZO film of the channel layer is made thin, in a method for suppressing the depletion of the Vth. In the TFT with the bottom gate structure, the reason is that the backchannel side of the IGZO film is easily controlled in accordance with a gate voltage. In addition, when the voltage is negative, the energy band in the backchannel is not likely to be decreased, and the electrons are not easily induced. However, if the film thickness of the IGZO film of the channel layer is made thin, the parasitic capacitance Cgs or Csd of the bottom gate TFT increases. That is, there is a trade-off between the directions of measures for the thickness of the IGZO film.

In Japanese Unexamined Patent Application Publication No 2010-67849, no consideration is given at all to a problem and its measure in a case where a channel protection film is formed for protecting the channel layer on the oxide semiconductor layer as a channel layer, and also measures for attaining both suppression of Vth depletion and reduction of the parasitic capacitances (Cgs, Cgd).

SUMMARY OF THE INVENTION

An object of the present invention is to provide a thin film transistor which can attain both suppression of Vth depletion and reduction of parasitic capacitances (Cgs, Cgd) even in a case where a channel protection film is provided on an oxide semiconductor layer as a channel layer, and a display device which provides high image quality and displays excellent images using the transistor.

To attain the above object, according to one aspect, there is provided a bottom gate thin film transistor using a first oxide semiconductor as a channel layer, the transistor comprising:

a substrate, a gate electrode which is formed on the substrate, a gate insulating film which is formed on the gate electrode, a first oxide semiconductor layer as a channel layer which is formed on the gate insulating film, a channel protection layer which is formed on the first oxide semiconductor layer as the channel layer;

a first laminated film which includes a source electrode and a second oxide semiconductor layer formed to extend from the first oxide semiconductor layer to one upper end part of the channel protection layer in a source region;

a second laminated film which includes a drain electrode and a second oxide semiconductor layer formed to extend from the first oxide semiconductor layer to other upper end part of the channel protection layer in a drain region; and a passivation film which is formed to cover the source electrode, the channel protection film, and the drain electrode, and wherein the first and second oxide semiconductor layers include indium and oxygen, and a content ratio of oxygen to indium (O/In) of the second oxide semiconductor layer is equal to or larger than that of the first oxide semiconductor layer, and a film thickness of the second oxide semiconductor layer is thicker than that of the first oxide semiconductor layer below the channel protection layer.

There is provided a display device which includes a display unit and a driving circuit unit, wherein the display unit includes a thin film transistor having the above-described structure.

According to the present invention, it is possible to provide a thin film transistor which can attain both suppression of Vth depletion and reduction of parasitic capacitances (Cgs, Cgd) even when a channel protection film is provided on an oxide semiconductor layer as a channel layer, and also a display device which provides high image quality and long-term reliability using the transistor.

BRIEF DESCRIPTION OF DRAWINGS

FIG. 1 is a cross sectional view of a thin film transistor according to a first embodiment of the present invention.

FIG. 3 is a diagram for comparing electrical properties between a thin film transistor having the first and second oxide semiconductor layers and a thin film transistor having only the first oxide semiconductor layer, according to the first embodiment of the present invention.

DESCRIPTION OF THE EMBODIMENTS

Figure 2A:
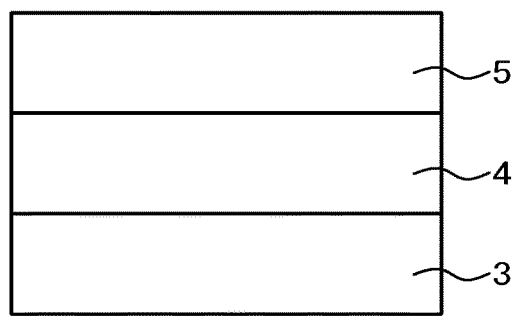
FIG. 2A is a cross sectional view of a sample for analyzing a first oxide semiconductor layer (IGZO) in the thin film transistor according to the first embodiment of the present invention.

The present invention will now specifically be described based on the embodiments.
Embodiment 1
A first embodiment of the present invention will now specifically be described using FIG. 1 to FIG. 3. The same constituent elements are denoted by the same reference numerals.

First, descriptions will be made to a cross sectional structure of a thin film transistor (TFT) according to a first embodiment of the present invention. FIG. 1 is a cross sectional view of the TFT according to this embodiment. This TFT is a bottom gate TFT having a channel protection layer 5, and has a substrate 1, a gate electrode 2, a gate insulating film 3, a first oxide semiconductor layer 4 to serve as a channel layer, a channel protection layer 5, second oxide semiconductor layers 6a and 6b, a source electrode 7a, a drain electrode 7b, and a passivation film 8. In this embodiment, "7a" denotes a source electrode, while "7b" denotes a drain electrode. However, "7a" may denote the drain electrode, while "7b" may denote a source electrode. In this specification, each electrode is formed in accordance with the same process as those for the wiring connected to each electrode. Thus, the "electrode" may sometimes be referred to as "electrode wiring".

In this TFT, the film thickness of the first oxide semiconductor layer 4 as the channel layer is thinner than that of the second oxide semiconductor layers 6a and 6b formed in a source/drain region. Thus, it is possible to attain both suppression of Vth depletion and reduction of parasitic capacitances Cgs and Cgd. Particularly, in the bottom gate shielding structure, a photo-leakage current is not easily generated, because the first oxide semiconductor layer 4 as the channel layer has a very thin thickness, and because of the gate shielding structure. Note that this photo-leakage current is due to the high reduction effect of the parasitic capacitances and irradiation of the backlight light. Further, a Vth shift does not easily occur, and is caused by gate stress and light irradiation.

The first and second oxide semiconductor layers have at least indium (In) and oxygen (O). The second oxide semiconductor layers 6a and 6b are formed on the first oxide semiconductor layer 4, in the source/drain region from which the channel protection layer 5 is exfoliated. In the second oxide semiconductor layers 6a and 6b, the concentration ratio of "O" to "In" (O/In) is approximately equal to or larger than that of the first oxide semiconductor layer 4. When the channel protection layer is formed in accordance with, for example, plasma CVD, oxygen deficiency may occur, or metallic elements may easily be diffused in the first oxide semiconductor layer 4, due to the plasma damage. Thus, in the TFT formed of only the first oxide semiconductor layer 4, Vth is easily depleted, and a Vth shift largely occurs due to the gate stress. In this embodiment, there are formed the second oxide semiconductor layers 6a and 6b having the O/In ratio equal to or higher than that of the first oxide semiconductor layer 4. From this point, the damage of the first oxide semiconductor layer 4 is easily recovered by performing an annealing process, and the Vth depletion and the Vth shift are easily suppressed. The second oxide semiconductor layers 6a and 6b can be used, as long as the $^{113}$In concentration in the second oxide semiconductor layers 6a and 6b is a 0.1 to 1 times the $^{113}$In concentration of the first oxide semiconductor layer 4, and also as long as the $^{115}$In$^{16}$O concentration is 1 to 2 times that of the first oxide semiconductor layer 4 (1 to 1.5 times is practical, and 1.05 to 1.3 times is preferred). Outside these ranges, the Vth depletion or high resistivity may easily occur.

The first and second oxide semiconductor layers have Zn or Ga, in addition to In and O, thereby controlling the carrier electron concentration. The film thickness of the first oxide semiconductor layer as the channel layer is preferably in a range from 5 nm to 50 nm. If this film thickness is less than 5 nm, the first oxide semiconductor layer may fearfully be etched and exfoliated with an alkaline stripping solution, in a resist stripping process when processing the first oxide semiconductor layer. If the film thickness exceeds 50 nm, the backchannel of the TFT is not easily controlled in accordance with a gate voltage, and the Vth is easily depleted.

The film thickness of the source/drain region layer is preferably in a range from 10 nm to 20 nm. If the film thickness is less than 10 nm, the parasitic capacitances Cgs and Cgd become high. If the film thickness exceeds 200 nm, the source/drain region layer has a high resistance, resulting in a decrease in the ON current or an increase in ON resistance.

In the second oxide semiconductor layer or the first oxide semiconductor layer, the O concentration is preferably 1 to 1.5 times that of the channel protection layer. If the O concentration is less than 1 times, the Vth is easily depleted. If the O concentration exceeds 1.5 times, the TFT has a high resistance, resulting in a decrease in the ON current or an increase in ON resistance. Like this embodiment, when both of the gate insulating film 3 and the channel protection layer 5 are formed of silicon oxide (SiO), as illustrated in FIG. 1, the surface of the gate insulating film 3 is etched to easily have a thin thickness, at the time of etching the channel protection layer 5 on the first oxide semiconductor layer 4. This may be a factor of decreasing the gate breakdown voltage. In this embodiment, the second oxide semiconductor layers 6a and 6b are formed between the gate insulating film 3, the source electrode wiring 7a, and the drain electrode wiring 7b. In general, the oxide semiconductor film has a high withstanding voltage. As a result, it does not result in a problem of decreasing the gate breakdown voltage.

Figure 2B:
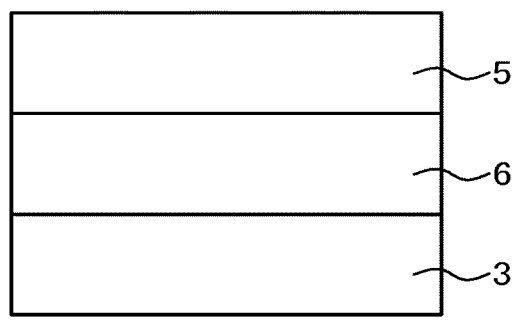
FIG. 2B is a cross sectional view of a sample for analyzing a second oxide semiconductor layer in the thin film transistor according to the first embodiment of the present invention.

Descriptions will now be made to an analysis result of indium (In) and oxygen (O) in the first and second oxide semiconductor layers (IGZO). For "In", $^{113}$In is detected, and for "O", $^{115}$In$^{16}$O is detected. FIG. 2A is a cross sectional view of a sample for SIMS analyzing "In" and "O" in a first IGZO layer, and illustrates a multi-layer structure in which the first IGZO layer 4 is sandwiched between the silicon oxide film 3 corresponding to the gate insulating film and the silicon oxide film 5 corresponding to the channel protection layer. FIG. 2B is a cross sectional view of a sample for SIMS analyzing "In" and "0" in a second IGZO layer, and illustrates a multi-layer structure in which the second IGZO layer 6 is sandwiched between the silicon oxide film corresponding to the gate insulating film and the silicon oxide film 5 corresponding to the channel protection layer.

Figure 2C:
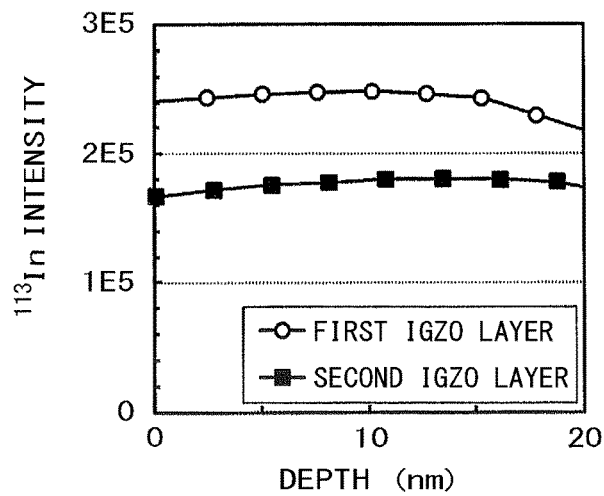
FIG. 2C is a graph illustrating an example of an analysis result of $^{113}$In of the sample illustrated in FIG. 2A and FIG. 2B.

FIG. 2C illustrates a comparison result of the $^{113}$In intensity in the first IGZO layer 4, as obtained with the sample illustrated in FIG. 2A, and the $^{113}$In intensity in the second IGZO layer 6, as obtained with the sample illustrated in FIG. 2B. In this analysis, the average intensity of $^{113}$In in the second IGZO layer is 0.73 times the average intensity of $^{113}$In in the first IGZO layer.

Figure 2D:
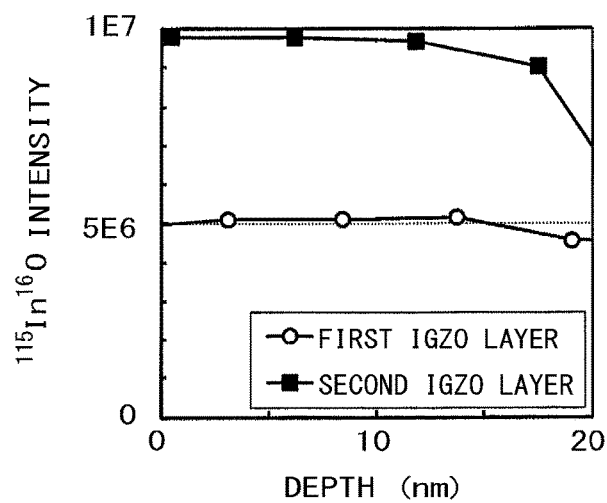
FIG. 2D is a graph illustrating an example of an analysis result of $^{115}$IN$^{16}$ of the sample illustrated in FIG. 2A and FIG. 2B.

FIG. 2D illustrates a comparison result of the $^{115}$In$^{16}$O intensity in the first IGZO layer 4, as obtained with the sample illustrated in FIG. 2A, and the $^{115}$In$^{16}$O intensity in the second IGZO layer 6, as obtained with the sample illustrated in FIG. 2B. In this analysis, the average intensity of $^{115}$In$^{16}$O in the second IGZO layer is 1.98 times the average intensity of $^{115}$In$^{16}$O the first IGZO layer, while the O concentration in the second IGZO layer is greater than the O concentration in the first IGZO layer.

To examine the electrical properties of the TFT according to this embodiment, a TFT having a bottom gate structure with the channel protection layer is manufactured, and its properties are examined. The channel protection layer is manufactured using a plasma CVD method. The method for manufacturing the TFT will be described in detail in an embodiment 2.

In this embodiment, as the first oxide semiconductor layer and the second oxide semiconductor layer, there are formed the first IGZO layer and the second IGZO layer having the $^{113}$In intensity and the $^{115}$In$^{16}$O intensity illustrated in FIG. 2C and FIG. 2D. Further, the film thickness of the second IGZO layer in the source/drain region is thicker than the film thickness of the first IGZO layer in the channel region. In this case, the film thickness of the first IGZO layer in the channel region is 15 to 25 nm, while the film thickness of the second IGZO layer in the source/drain region is 40 to 50 nm.

If the present invention is not applied, there is formed only the first IGZO layer having the $^{113}$In intensity and In$^{16}$O intensity illustrated in FIG. 2C and FIG. 2D. The channel region and the source/drain region have the same film thickness (15 to 25 nm).

FIG. 3 illustrates a comparison of the electrical properties of a thin film transistor having the first and second oxide semiconductor layers and a thin film transistor having only the first oxide semiconductor layer, according to this embodiment. Based on this result, in the TFT according to this embodiment, it is understood that the drain current decreases in the ON region at the time when the gate voltage is between 10 and 20V, and that the rising of the drain current shifts in an enhancement direction of approximately 2V. If the drain current in the ON region decreases to this extent (mobility of approximately 9 cm$^2$/V·s can be obtained), there is no problem in the writing into pixels and in the output of the peripheral circuits. As an operation of the peripheral circuits, there is an advantage that the Vth shifts into a positive direction in the application of the present invention, than in the non-application of the present invention where the Vth is depleted. To decrease the parasitic capacitance, the film thickness of the source/drain region is preferably increased greater than that in this embodiment. In this case, it is estimated that the drain current in the ON range decreases. However, this decrease is acceptable as long as required panel performances (writing into pixels or outputting of peripheral circuits) are obtained.

According to this embodiment, it is possible to provide a thin film transistor that can attain both of suppression of Vth depletion and reduction in the parasitic capacitances (Cgs, Cgd) even when a channel protection film is formed on the oxide semiconductor layer as the channel layer.

Embodiment 2

Figure 4:
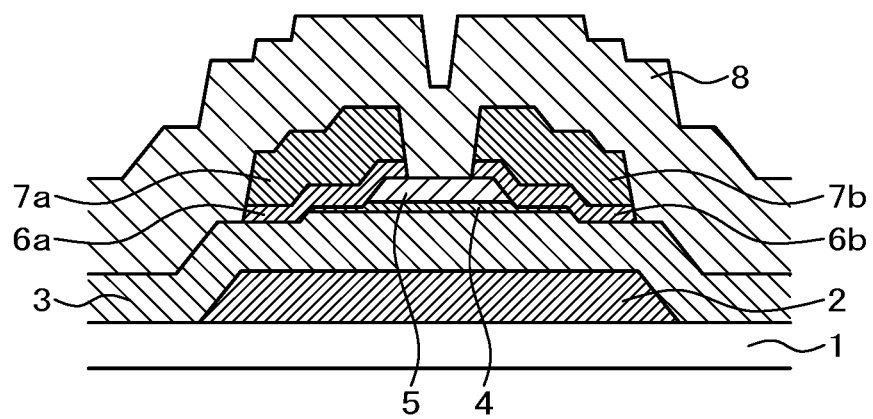
FIG. 4 is a cross sectional view illustrating a thin film transistor according to a second embodiment of the present invention.

A second embodiment will now be described using FIG. 4 to FIG. 7. Those matters described in the embodiment 1 but not described in this embodiment are applicable also into this embodiment, unless there are special circumstances. FIG. 4 is a cross sectional view of a thin film transistor (TFT) according to this embodiment. In this embodiment, what differs from the embodiment 1 is that the film thickness of the first oxide semiconductor layer 4 in the source/drain region is thinner than the film thickness in the channel region. Other structural elements are the same as those of the embodiment 1, and thus will not be described again.

A method for manufacturing the TFT according to this embodiment will be described using FIG. 5A to FIG. 5D.

FIG. 5A to FIG. 5D illustrate procedures for manufacturing the TFT according to this embodiment (illustrate only the main parts of the TFT). This TFT is also a bottom gate TFT having a channel protection layer. The typical manufacturing procedures are as follows.

Figure 5A:
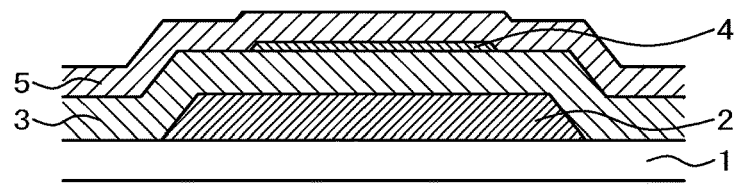
FIG. 5A is a manufacturing process diagram of the thin film transistor according to the second embodiment of the present invention.

(1) First, an insulating substrate 1 is prepared (FIG. 5A).

As the insulating substrate 1, for example, a glass substrate is used. Alternatively, it is possible to use a glass substrate, on which a silicon oxide film (SiO film) or silicon nitride film (SiN) is formed using a plasma CVD method as an undercoat film.

(2) After a metal film is formed with sputter film formation, the gate electrode wiring 2 is formed using photolithography etching (wet or dry) processing (FIG. 5A).

A gate electrode wiring material (s) may, for example, be metal of or an alloy of, and a laminated layer of Nb, Mo, W, Ta, Cr, Ti, Fe, Ni, and Co. In this embodiment, the upper limit temperature in TFT manufacture is lowered to 400° C. or below in the total process. Thus, it is also possible to use low resistance metal, such as Al or Cu. The film formation is preferably performed using a sputtering method. The film thickness needs to have a value that the wiring resistance does not increase. In this embodiment, the film thickness is 200 nm, but may also be in a range from, for example, 50 to 400 nm.

(3) The gate insulating film 3 is formed using a plasma CVD method (FIG. 5A).

An SiO film is preferably used as the gate insulating film. However, an SiON film or a laminated layer of an SiO film and an SiN film may also be used. A TEOS-based film may also be used. An SiO film is preferably formed on the side of the first oxide semiconductor layer 4. In the case of the SiN film, the first oxide semiconductor layer 4 is likely to be reduced due to a large volume of hydrogen included in the SiN film, thus the SiN film is not preferred.

The film formation method for the SiO film is preferably performed using plasma CVD. Other than the plasma CVD method, applicable methods include, for example, a thermal CVD method and an optical CVD method, at a low film formation temperature. The plasma CVD apparatus maybe an apparatus having a parallel-plate type electrode structure, an apparatus having an antenna type electrode structure, or the like. To form an SiO film using the plasma CVD method, typically, SiH$_4$ (monosilane) and N$_2$O (nitrous oxide) as material gas are supplied. At the time of film formation, a carrier gas (for example, Ar (argon)) is supplied simultaneously with the material gas. The flow ratio of these gases is determined in accordance with the apparatus performance or the substrate area. The RF frequency in the plasma CVD method is typically 13.56 MHz, but any other RF frequencies are possible. The RF power is determined in accordance with the apparatus size or the substrate area. When the parallel-plate type plasma CVD apparatus is used, the distance between electrodes maybe adjusted in a manner that plasma discharge is stably maintained. The film formation temperature is preferably 200° C. or greater to obtain film quality for securing the withstanding voltage as the gate insulating film and reliability of the TFT. When the gate electrode wiring 2 is Al, the temperature is preferably 400° C. or below to prevent occurrence of abnormality, such as hillock. The film formation pressure needs to be controlled in accordance with the applied RF frequency or electrode specifications. The film thickness maybe in a range, for example, from 100 nm to 400 nm, to secure the gate breakdown voltage and to prevent that the film thickness of the gate electrode wiring 2 on the side end part becomes thin. To obtain a necessary drain current with a determined gate voltage, the thickness is desired to be, for example, 400 nm or below.

Typical examples of the film formation conditions are as follows.
- Apparatus: parallel-plate type plasma CVD,
- Gas flow ratio: $SiH_4/N_2O=1/75$
- RF frequency: 13.56 to 27.12 MHz,
- RF power density: around 2 $W/cm^2$
- distance between electrodes: around 20 mm,
- substrate temperature: 350° C.,
- film formation pressure 100 to 200 Pa (4) After the oxide semiconductor layer is formed using a sputtering method, the first oxide semiconductor layer 4 is formed using photolithography etching (wet) processing (FIG. 5A).

As the first oxide semiconductor layer, an IGZO film in an amorphous state is preferably used. As a material, an In—Zn-based oxide or an In—Ga-based oxide is also applicable. As a film state, the film may be crystalline.

The film formation may preferably be performed using a sputtering method. However, if possible, a CVD method is also possible. A sputtering system may be any of a DC power source type system and an AC power source type system. The target is preferably In:Ga:Zn=1:1:1, but some change may be made in the ratio. At the sputter film formation, oxygen ($O_2$) and Ar are introduced as sputtering gases. The flow ratio of these gases and the partial pressure are determined in accordance with the apparatus performance or the substrate area. The film formation temperature may be the room temperature, but may also be increased up to approximately 100° C. to improve the film quality. The film thickness is from 5 to 50 nm. When a single film is formed, the specific resistance is preferably from 1E6 to 1E8 (Ω·cm).

Typical examples of the film formation conditions are as follows.
- Apparatus: DC sputtering,
- $O_2$ partial pressure: 0.01 to 0.1 Pa,
- power density: 0.3 to 1 $W/cm^2$,
- substrate temperature: room temperature An oxalic acid-based solution is used as a wet etching solution for the oxide semiconductor film.

(5) The insulating film 5 for the channel protection layer is formed using plasma CVD. The structure illustrated in FIG. 5A is manufactured in accordance with the following procedures.

A material gas for forming the insulating film 5 for the channel protection layer is preferably an $SiH_4/N_2O$-based SiO film (particularly, with a low hydrogen content or water content and with a refractive index from 1.46 to 1.48).

The CVD method is applicable as a film formation method for the SiO film for the channel protection film. However, the plasma CVD method is more preferably applied. In this case, the electrode structure, the carrier gas, and the RF frequency are the same as those of the gate insulating film 3. The distance between the electrodes is adjusted in a manner that plasma discharge is stably maintained. In many cases, however, the flow ratio of the material gas, the RF power, the film formation temperature, and the film thickness are preferably different from those at the film formation of the gate insulating film 3. Descriptions will now be made to those points to be considered at the time of forming the insulating film for the channel protection layer.

(a) Flow Ratio of Material Gas

It is preferred the flow ratio of $SiH_4$ is lower than $N_2O$, to prevent that the first oxide semiconductor layer 4 is reduced due to hydrogen or to prevent that it becomes in a conductor form, as much as possible. It is a mater of consideration that the flow ratio of $SiH_4$ does not become too low, to avoid forming any film with a low refractive index.

(b) RF Power

Low power is preferred, to lower plasma damage on the first oxide semiconductor layer 4, as much as possible. However, too low power is a matter of consideration, because a film with a large hydrogen content is likely to be formed without progressing the resolution of an $N_2O$ gas.

(c) Film Formation Temperature

A low film formation temperature is preferred, to reduce damage on the first oxide semiconductor layer 4. However, a too low temperature is a matter of consideration, because a film with a low refraction index or a large hydrogen/water content is likely to be formed.

(d) Film Thickness

The film thickness is preferably thin, because some problems may occur. If the film thickness of the channel protection layer is too thick, the Vth of the TFT is easily depleted, and it is weak against the gate stress.

Typical examples of the film formation conditions are as follows.
- Apparatus: parallel-plate type plasma CVD,
- gas flow ratio: $SiH_4/N_2O=1/100$ or the like,
- RF frequency: 13.56 to 27.12 MHz,
- RF power density: 0.5 to 1.5 W/cm2,
- distance between electrodes: around 20 mm,
- substrate temperature: 150 to 250° C.,
- film formation pressure: 100 to 200 Pa Further, at the time of forming the channel protection layer 5, to oxidize the first oxide semiconductor layer 4, it is possible to add a plasma process using $N_2O$ or $O_2$. As conditions for this process, the same conditions as those at the time of forming the SiO film are applied, other than the condition that $SiH_4$ is not introduced (or only a small volume thereof, if introduced). In another applicable method, $N_2O$ or $O_2$ is simply flowed, without generating plasma.

Figure 5B:
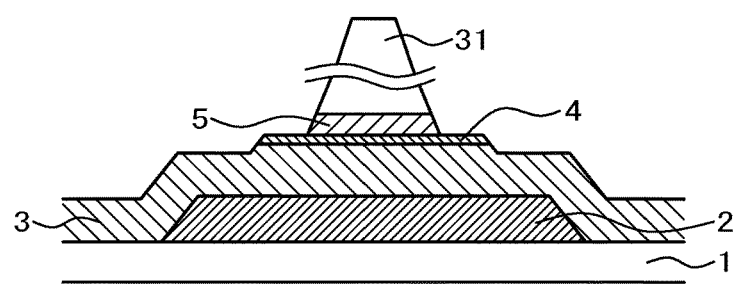
FIG. 5B is a manufacturing process diagram of the thin film transistor according to the second embodiment of the present invention.

(6) An annealing process is performed, to adjust the first oxide semiconductor layer 4 to provide applicable film quality as a channel layer of the TFT from the film quality right after sputter-formed (FIG. 5B).

Preferred atmospheres as the anneal atmosphere include the air atmosphere, the oxide atmosphere, the steam atmosphere, and the mixed atmosphere of any of these atmospheres together with nitrogen. The applied anneal temperature is 400° C. or below, but is preferably 200° C. or greater for promoting the anneal effect.

(7) The channel protection layer 5 is formed using photolithography etching (dry or wet) processing. The structure illustrated in FIG. 5B is manufactured in accordance with the following procedures. FIG. 5B illustrates a state before exfoliating resist 31 on the channel protection layer 5.

If both of the gate insulating film 3 and the channel protection layer 5 are SiO films, not only the channel protection layer 5 is etched at the etching, but also the surface of the gate insulating film 3 is partially etched, in a region except where the first oxide semiconductor layer 4 is formed in the cannel region of the TFT. This is a factor for decreasing the gate breakdown voltage. However, in this embodiment, the gate breakdown voltage does not decrease, because the oxide semiconductor film generally has a high breakdown voltage, and the second oxide semiconductor layers 6a and 6b are formed between the gate insulating film 3, the source electrode wiring 7a, and the drain electrode 7b.

Figure 5C:
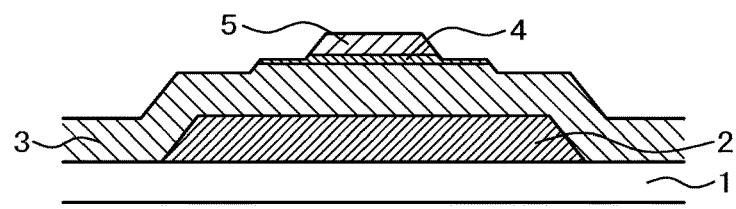
FIG. 5C is a manufacturing process diagram of the thin film transistor according to the second embodiment of the present invention.

(8) The resist 31 on the channel protection layer 5 is exfoliated (wet). The structure illustrated in FIG. 5C is manufactured in accordance with the following procedures.

At this time, in a region except where the channel protection layer 5 is formed, the first oxide semiconductor layer 4 is film-thinned by an alkaline resist exfoliating solution.

Figure 5D:
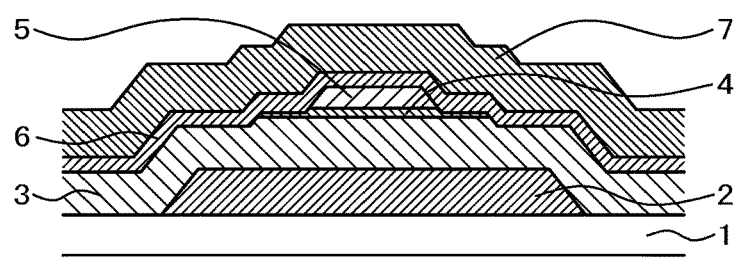
FIG. 5D is a manufacturing process diagram of the thin film transistor according to the second embodiment of the present invention.

(9) The oxide semiconductor layer 6 and a metal layer 7 are sputter-formed. The structure illustrated in FIG. 5D is manufactured in accordance with the following procedures.

The oxide semiconductor layers as the second oxide semiconductor layers 6a and 6b are formed in accordance with substantially the same method as that for the first oxide semiconductor layer 4. However, the $O_2$ partial pressure at the film formation or the specific resistance of the single film is equal to or greater than that of the first oxide semiconductor layer 4. The film thickness is preferably in a range from 10 to 20 nm.

Typical examples of the film formation conditions are as follows.

Apparatus: DC sputtering,
$O_2$ partial pressure: 0.05 to 0.2 Pa,
power density: 0.3 to 1 $W/cm^2$,
substrate temperature: room temperature,
specific resistance is preferably 5E6 to 5E8 ($\Omega \cdot cm$), at the formation of a single film.

It is possible to use Nb, Mo, W, Ta, Cr, Ti, Fe, Ni, Co, or an alloy thereof, and a laminated layer thereof, as a material of a metal layer for the source electrode wiring 7a and the drain electrode wiring 7b. The upper limit temperature in the TFT manufacture can be decreased in the total process. Thus, it is possible to use low resistance metal, such as Al, Cu, or the like. This film thickness may be in a range from 150 to 500 nm for lowering the wiring resistance, depending on the material.

(10) The source electrode wiring 7a, the second oxide semiconductor layer 6a and the drain electrode wiring 7b of the source region, and the second oxide semiconductor layer 6b of the drain region are formed, using photolithography etching (totally wet, or dry & wet) processing. When the metal film is wet-etched using acid, the oxide semiconductor layer is totally etched as well (FIG. 4).

(11) The insulating film is formed using plasma CVD, to form the passivation film 8 (FIG. 4).

The SiO film is substantially preferred as a passivation film, and the same conditions as those for forming the channel protection layer 5 are used. However, to form a film with low water-permeability (moisture-absorption) and a large refraction index, the film formation temperature for the SiO film may be increased up to approximately 350° C., the SiON film or SiN film may be laminated on the SiO film, or the SiON film or SiN film may be formed in the form of a single layer.

(12) After this, an annealing process is performed, particularly, to adjust the second oxide semiconductor layers 6a and 6b to have applicable film quality as a source/drain region of the TFT from the film quality right after sputter-formed. The annealing conditions may be the same as those of (6). The TFT structure illustrated in FIG. 4 is manufactured in accordance with the following procedures.

The TFT which has been manufactured in accordance with the above manufacturing method has the same effect as the embodiment 1. Further, the surface side of the first oxide semiconductor layer 4 is film-thinned in a region except where the formation region of the channel protection layer 5 is formed, simultaneously with exfoliation of the resist 31 remaining on the channel protection layer 5. This results in removing at least a part of a damage layer generated in the first oxide semiconductor layer 4. Due to damage at the time of processing the channel protection layer 5 using a dry etching method, oxygen deficiency occurs or the conductor form region is reduced, in the first oxide semiconductor layer 4. As compared with the first embodiment, there are more advantages that the Vth depletion of the TFT can further easily be suppressed, and that it is not easily reduced due to hydrogen.

Descriptions will now be made to an example in which the TFT illustrated in FIG. 4 is applied into a pixel TFT of a display device including a display unit and a driving circuit unit.

Figure 6:
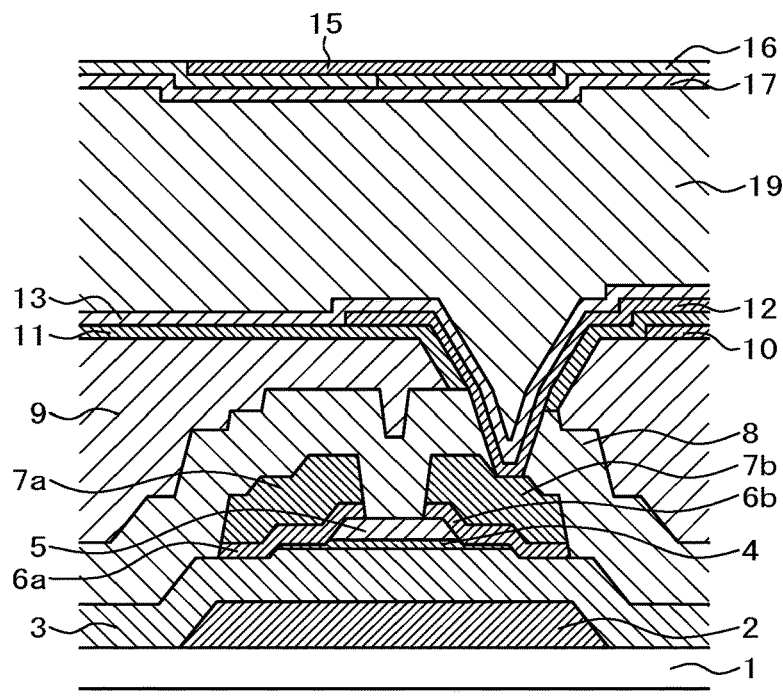
FIG. 6 is a principal cross sectional view of a display device (a liquid crystal display device in an IPS display mode) using the thin film transistor according to the second embodiment of the present invention.

FIG. 6 is a principal (pixel TFT) cross sectional view of a display device (a liquid crystal display device in an IPS display mode) with a thin film transistor according to this embodiment. A common electrode 10 and an pixel electrode 12 are provided on the substrate 1 with the TFT formed thereon, and an electric field is applied using these, thereby changing the alignment of the liquid crystal molecules into a parallel direction with the substrate 1. In current Smart Phones (registered trademark) or tablet terminals, the visibility characteristics are very good. Thus, the IPS display mode is standardized and applied thereinto.

In the present display device, after the TFT is formed, an organic planarization film 9 which is formed of, for example, an organic resin is formed on the protection insulating film (passivation film) 8. After this, a contact hole is formed on the organic planarization film 9 of the drain electrode 7b. Next, the common electrode 10 which is formed of an ITO film with a thickness of, for example, 50 to 100 nm is processed and formed. A capacitor insulating film 11 is formed on the common electrode 10 and on the organic planarization film 9 where this electrode is not formed. The capacitor insulating film is preferably an SiN film having a high relative dielectric constant. The film thickness is preferably in a range from 10 to 300 nm, though it depends on the pixel size. In the TFT illustrated in FIG. 4, the parasitic capacitances Cgs and Cgd are reduced. Thus, problems (for example, a flicker) may not easily occur, even lowering the retention volume of the capacitor insulating film, and a relatively thick film thickness, 200 to 300 nm, is possible. In the pixel formation region on the capacitor insulating film 11, the pixel electrode 12 which is formed of an ITO film (film thickness of, for example, 50 to 100 nm) is processed and formed. After this, an alignment film 13 is formed on the pixel electrode 12. An opposite substrate which is formed of a black matrix (BM) layer 15, a color filter 16, and an alignment film 17 is formed, and is stuck with the TFT formation substrate. Then, if liquid crystal 19 is enclosed therein, the liquid crystal display device illustrated in FIG. 6 is completed.

In the general bottom gate TFTs, the parasitic capacitances Cgs and Cgd are likely to be large. Thus, problems are that the pixel voltage shift (generally, called a punch-through voltage) is easily generated at the completion of pixel writing, and that a flicker is likely to appear. To reduce the punch-through voltage, it is necessary to enhance the capacity by forming a thin film thickness (for example, 100 nm) of the capacitor insulating film, as a solution therefor. The formation of a thin thickness of the capacitor insulating film causes reduction of productivity (reduction of yield) of the TFT, specifically, degradation of the coverage of the contact hole part. On the other hand, if the TFT described in the embodiment 1 or the embodiment 2 is applied, the punch-through voltage is likely to be reduced even without forming the thin film thickness of the capacitor insulating film, because the parasitic capacitances Cgs and Cgd are reduced. Therefore, its characteristic advantage is that it is easy to avoid reduction of productivity of the TFT.

In FIG. 6, the TFT has the structure illustrated in FIG. 4. However, the TFT of the embodiment 1 or another embodiment is also applicable. It is also applicable to the liquid crystal display device not only in the IPS display mode, but also in another display mode.

As an evaluation result of the present display device (liquid crystal display device in the IPS display mode), it is confirmed that it provides high quality and long-terminal stability.

Figure 7:
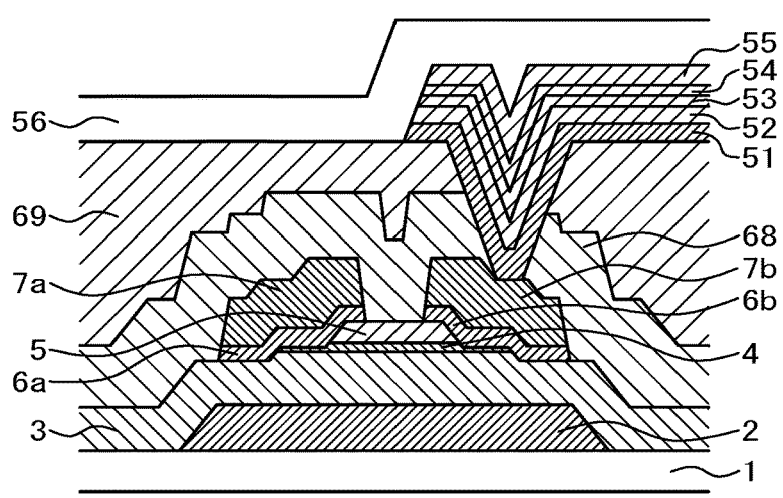
FIG. 7 is a principal cross sectional view of a display device (OLED) using the thin film transistor according to the second embodiment of the present invention.

FIG. 7 is a principal (pixel TFT) cross sectional view of a display device (OLED) using the TFT illustrated in FIG. 4. In the present display device, after the TFT is formed, an organic planarization film 69, which is formed of, for example, an organic resin, is formed on a protection insulating film (passivation film) 68. After this, a contact hole is formed on the formation region of the drain electrode wiring 7b. In this region, a pixel electrode 51, which is formed of, for example, Al, is formed. A metal reflection film or transparent electrode can be applied as the pixel electrode 51, and its film thickness is preferably 100 nm. A charge transport layer 52, a light emission layer 53, and a charge transport layer 54 of the OLED are formed using an evaporation method. Further, a sealing film 56 is formed, after forming an upper electrode 55, which is formed of a transparent conducting layer, using an evaporation or sputtering method. Then, the OLED display device illustrated in FIG. 7 is completed. In FIG. 7, the TFT has the structure illustrated in FIG. 4. However, the TFT described in another embodiment is also applicable.

According to the present embodiment, it is possible to provide a thin film transistor which can attain both suppression of Vth depletion and reduction of parasitic capacitances (Cgs, Cgd) even when the channel protection film is provided on the oxide semiconductor layer to be the channel layer, and a display device which realizes high quality performance and long-term reliability using the transistor.

Embodiment 3

Descriptions will now be made to a third embodiment of the present invention using FIG. 8. Those matters described in the embodiment 1 or the embodiment 2 but not described in this embodiment are applicable also into this embodiment, unless there are special circumstances.

Figure 8:
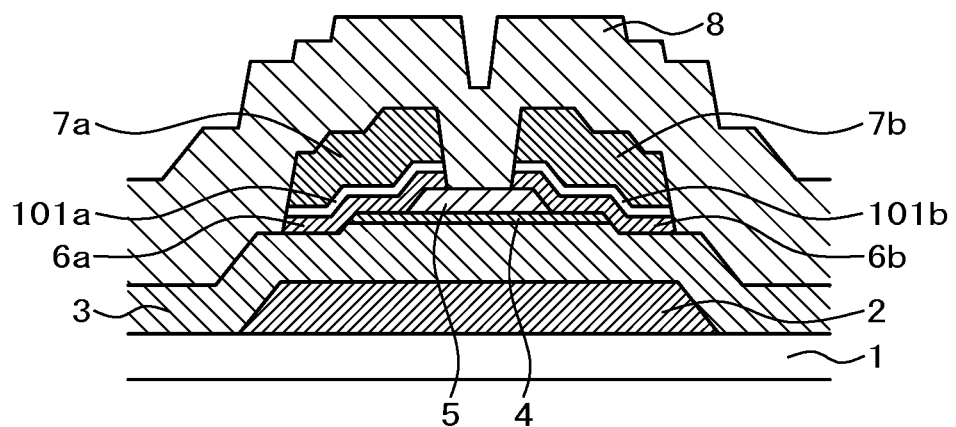
FIG. 8 is a cross sectional view of a thin film transistor according to a third embodiment of the present invention.

FIG. 8 is a cross sectional view of a thin film transistor (TFT) according to this embodiment. In the TFT according to this embodiment, what differs from the TFT illustrated in FIG. 1 is that a third oxide semiconductor layer 101a as a source contact layer is formed between the second oxide semiconductor layer 6a and the source electrode wiring 7a, in the source region. In addition, a third oxide semiconductor layer 101b as a drain contact layer is formed between the oxide semiconductor layer 6b and the drain electrode wiring 7b, in the drain region. Other elements are the same as the above, and thus will not be described again.

The source contact layer 101a and the drain contact layer 101b in the TFT according to this embodiment can be formed in accordance with substantially the same method as that for first oxide semiconductor layer 4 and the second oxide semiconductor layers 6a and 6b. However, the O$_2$ partial pressure at the film formation and the specific resistance of the single film are preferred to be lower than that of the second oxide semiconductor layers 6a and 6b. It is possible to control the specific resistance of the oxide semiconductor by changing the oxygen partial pressure of the atmosphere or the composition of the oxide semiconductor at the time of forming the oxide semiconductor layer. The film thickness of the source contact layer 101a and the drain contact layer 101b is preferably 1 nm to function as a contact layer. If the film is too thick, the Vth of the TFT may easily be depleted. Thus, it is preferably 20 nm or below.

Typical examples of the film formation conditions are as follows.
Apparatus: DC sputtering,
O$_2$ partial pressure: 0.005 to 0.02 Pa,
power density: 0.3 to 1 W/cm$^2$,
substrate temperature: room temperature,
specific resistance is preferably from 1E4 to 5E7 (Ω·cm), at the formation of single film. Note if the resistance is too low, the Vth may easily be depleted.

As an evaluation result on the TFT according to this embodiment, in addition to the effects attained in the embodiment 1, some effects are confirmed that the drain current of the TFT increases and the ON resistance decreases, as compared to the TFT illustrated in FIG. 1, because the source/drain series resistance is reduced. If it is applied into the liquid crystal display device, it is possible to provide a display device which displays excellent images.

According to this embodiment, it is possible to provide a thin film transistor which can attain both suppression of Vth depletion and reduction of parasitic capacitances (Cgs, Cgd) even when the channel protection film is provided on the oxide semiconductor layer as the channel layer, and also a display device which displays excellent images using the transistor. In addition, it is possible to provide a TFT in which the drain current is large and the ON resistance is small.

Embodiment 4

Descriptions will now be made to a fourth embodiment of the present invention. Those matters described in the embodiment 1 or the embodiment 2 but not described in this embodiment are applicable also into this embodiment, unless there are special circumstances.

Figure 9:
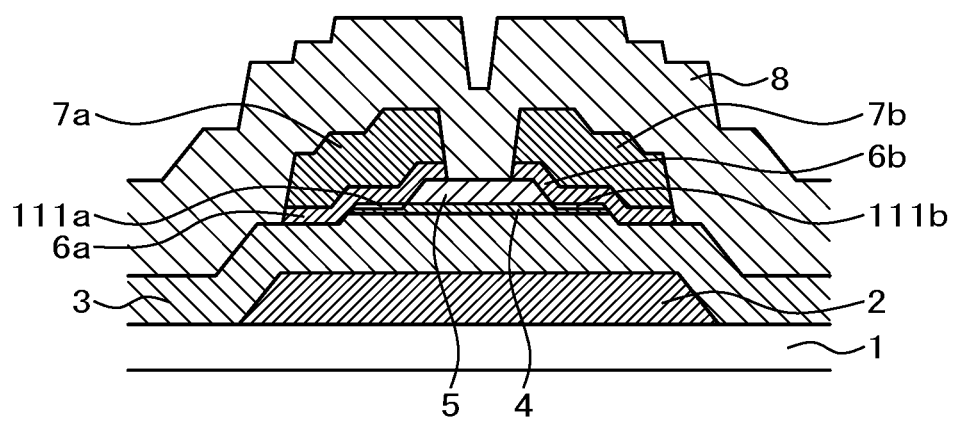
FIG. 9 is a cross sectional view of a thin film transistor according to a fourth embodiment of the present invention.

FIG. 9 is a cross sectional view of a thin film transistor in the TFT according to this embodiment of the present invention. In the TFT according to this embodiment, what differs from the TFT illustrated in FIG. 1 is that a fourth oxide semiconductor layer 111a in the source region is formed in the first oxide semiconductor layer 4 in the connection region with the second oxide semiconductor layer 6a in the source region. Further, in the TFT of this embodiment, a fourth oxide semiconductor layer 111b in the drain region is formed in the first oxide semiconductor layer 4 in the connection region with the second oxide semiconductor layer 6b in the drain region. Other elements are the same as the above, and thus will not be described again.

The fourth oxide semiconductor layer 111a in the source region and the fourth oxide semiconductor layer 111b in the drain region can be formed by supplying, for example, O$_2$, before forming the oxide semiconductor films as the second oxide semiconductor layers 6a and 6b. The substrate temperature at the time of supplying O$^2$ may be in a range from the room temperature to 200° C., but is more preferably in a range from 50° C. to 150° C. If the substrate temperature is too low, oxidation effects cannot be obtained, while if the temperature is too high, it results in excess oxidation.

Descriptions will now be made to effects of the fourth oxide semiconductor layer 111a in the source region and the fourth oxide semiconductor layer 111b in the drain region. Particularly, the surface side of the first oxide semiconductor layer 4 is easily damaged at the etching process for the channel protection film 5. If this damaged region remains, the Vth of the TFT is easily depleted. However, like this embodiment, by an oxidation process for the damage layer, the fourth oxide semiconductor layer 111a in the source region and the fourth oxide semiconductor layer 111b in the drain region are formed, thereby enabling to suppress depletion of the Vth.

As an evaluation effect on the TFT according to this embodiment, in addition to the effect attained in the embodiment 1, it is understood that the depletion of the Vth can be reduced. If it is applied in to the liquid crystal display device, it is possible to provide a display device which displays excellent images.

According to this embodiment, it is possible to provide a thin film transistor which can attain both suppression of Vth depletion and reduction of parasitic capacitances (Cgs, Cgd) even when the channel protection film is provided on the oxide semiconductor layer as a channel layer, and also a display device which displays excellent images using the transistor. In addition, controllability of the Vth can be improved.

Embodiment 5

Figure 10:
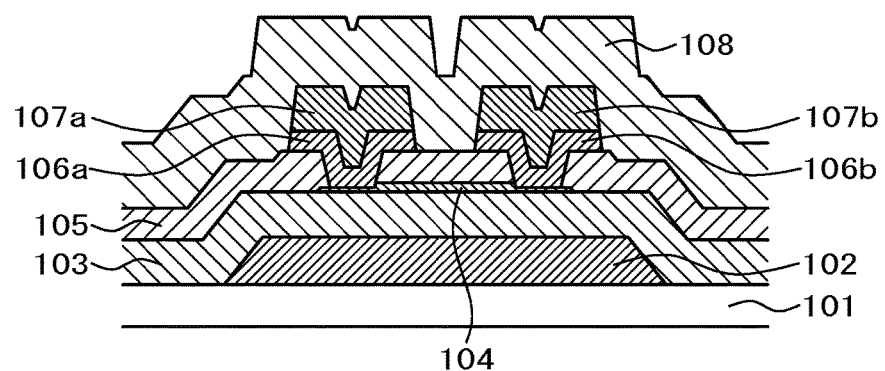
FIG. 10 is a cross sectional view of a thin film transistor according to a fifth embodiment of the present invention.

Descriptions will now be made to a fifth embodiment of the present invention using FIG. 10. Those matters described in the embodiment 1 or the embodiment 2 but not described in this embodiment are applicable also into this embodiment, unless there are special circumstances. FIG. 10 is a cross sectional view of a thin film transistor (TFT) according to this embodiment. In the TFT according to this embodiment, what differs from the TFT structure illustrated in FIG. 1 is that a first oxide semiconductor layer 104 is connected to second oxide semiconductor layers 106a and 106b, a source electrode 107a, and a drain electrode 107b, through a contact hole provided in a channel protection layer 105. Like FIG. 4, in this embodiment, the surface side of the first oxide semiconductor layer 104 in the contact hole part is film-thinned, simultaneously with exfoliation of the resist on the channel protection layer 105. A reference numeral 101 denotes a substrate, a reference numeral 102 denotes a gate electrode, a reference numeral 103 denotes a gate insulating film, and a reference numeral 108 denotes a passivation film.

In the TFT having the structure of this embodiment, a large region of the first oxide semiconductor layer 104 is covered with the channel protection layer 105, as compared with the covered region in the TFT having the structure illustrated in FIG. 1. Thus, the first oxide semiconductor layer 104 is unlikely to be exposed to moisture in the atmosphere, in those procedures after the etching processing of the first oxide semiconductor layer 104 until the film formations of the second oxide semiconductor layers 106a and 106b, the source electrode 107a, and the drain electrode 107b. As a result, the Vth of the TFT is not easily depleted. In the structure of FIG. 1, the surface side of the gate insulating film is etched at the time of etching processing of the channel protection film. However, in the TFT structure of this embodiment, such etching is not performed on the surface of the gate insulating film. This results in a high gate breakdown voltage.

As an evaluation result of the TFT according to this embodiment, in addition to the effects attained in the embodiment 1, it is confirmed that depletion of the Vth can be reduced. If it is applied into the liquid crystal display device, it is possible to provide a display device which displays excellent images.

According to this embodiment, it is possible to provide a thin film transistor which can attain both suppression of Vth depletion and reduction of parasitic capacitances (Cgs, Cgd) and also a display device which displays excellent images using it, even when a channel protection film is provided on the oxide semiconductor layer as a channel layer.

Embodiment 6

Descriptions will now be made to a sixth embodiment of the present invention using FIG. 11. Those matters described in the embodiment 1 or the embodiment 2 but not described in this embodiment are applicable also into this embodiment, unless there are special circumstances.

Figure 11:
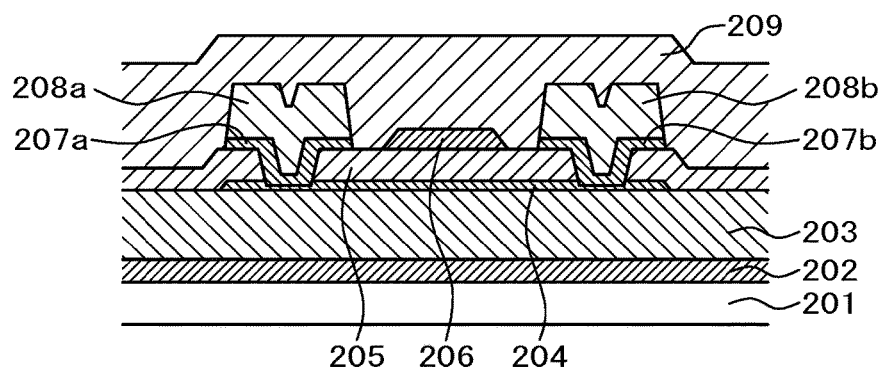
FIG. 11 is a cross sectional view of a thin film transistor according to a sixth embodiment of the present invention.
Figure 12:
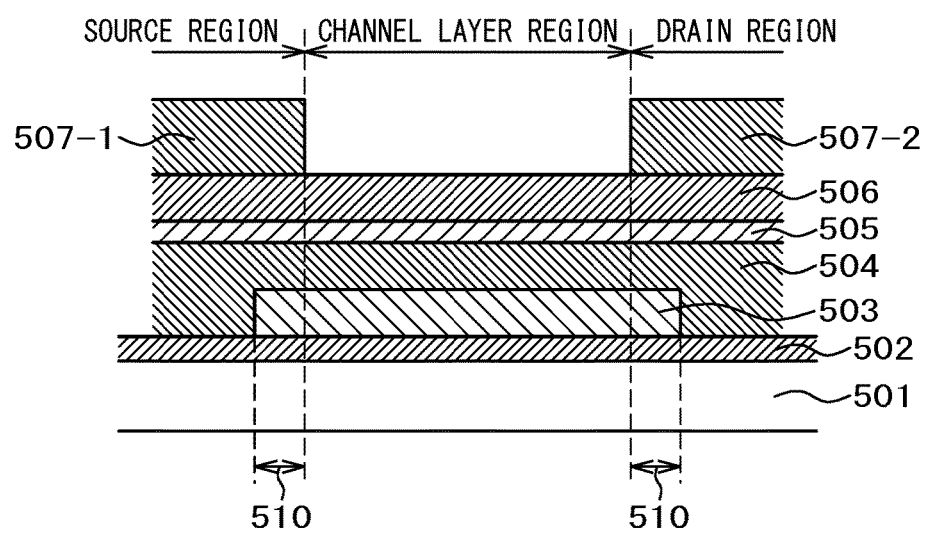
FIG. 12 is a cross sectional view of a conventional thin film transistor.

FIG. 11 is a cross sectional view of a thin film transistor (TFT) according to this embodiment. In the TFT according to this embodiment, what differs from that of the TFT illustrated in FIG. 1 is that a top gate structure is provided. This TFT has a substrate 201, a shielding metal film 202, a lower insulating film 203, a first oxide semiconductor layer 204, a gate insulating film 205, a gate electrode 206, a second oxide semiconductor film 207a in the source region, a second oxide semiconductor film 207b in the drain region, source electrode wiring 208a, drain electrode wiring 208b, and a passivation film 209. In this embodiment, the gate insulating film serves also as a channel protection layer.

In the top gate structure, there is no overlapped region of the gate electrode and the source/drain electrode. Thus, its feature is that the parasitic capacitances Cgs and Cgd are remarkably low as compared with those in the bottom gate structure.

In the top gate structure, the gate insulating film 205 needs to be formed after forming the first oxide semiconductor layer 204. The formation of the gate insulating film 205 is preferably performed at a high temperature to attain gate stress resistance of the TFT. For example, the temperature is preferably about 350° C., as described in the second embodiment. However, in the film formation at this high temperature, the surface side of the first oxide semiconductor layer 204 is easily damaged, and fearfully resulting in occurrence of the Vth depletion. In this embodiment, the surface of the first oxide semiconductor layer 204 in the contact hole part is thinned like the embodiments 2 or the embodiment 5, and the second oxide semiconductor layers 207a and 207b are further formed. As a result, the damage of the first oxide semiconductor layer is recovered, and the Vth depletion is suppressed.

As an evaluation result on the TFT according to this embodiment, the same effect as that of the embodiment 1 has been attained. If it is applied into the liquid crystal display device, it is possible to provide a display device which displays excellent images. According to this embodiment, it is possible to provide a thin film transistor which can attain both suppression of the Vth depletion and reduction of the parasitic capacitances (Cgs, Cgd) even when the channel protection film is provided on the oxide semiconductor layer as a channel layer, and also a display device which displays excellent images using the transistor.

Modes of the embodiments are as follows.

(1) In a bottom gate thin film transistor using a first oxide semiconductor as a channel layer, the transistor comprises:

a substrate, a gate electrode which is formed on the substrate, a gate insulating film which is formed on the gate electrode, a first oxide semiconductor layer as a channel layer which is formed on the gate insulating film, a channel protection layer which is formed on the first oxide semiconductor layer as the channel layer;

a first laminated film which includes a source electrode and a second oxide semiconductor layer formed to extend from the first oxide semiconductor layer to one upper end part of the channel protection layer in a source region;

a second laminated film which includes a drain electrode and a second oxide semiconductor layer formed to extend from the first oxide semiconductor layer to other upper end part of the channel protection layer in a drain region; and a passivation film which is formed to cover the source electrode, the channel protection film, and the drain electrode, and wherein the first and second oxide semiconductor layers include indium and oxygen, and a content ratio of oxygen to indium (O/In) of the second oxide semiconductor layer is equal to or larger than that of the first oxide semiconductor layer, and a film thickness of the second oxide semiconductor layer is thicker than that of the first oxide semiconductor layer below the channel protection layer.

(2) In a display device which has a display unit and a driving circuit unit, the display unit has the above-described thin film transistor (1).

The present invention is not limited to the above-described embodiments, and various modifications are included. For examples, the above embodiments have specifically been described to clearly describe the present invention, and are not necessarily limited to any structure including all of the described constituent elements entirely. A structure of a particular embodiment may be replaced with a part of a structure of another embodiment. A structure of an embodiment may be added to the structure of another embodiment. A part of the structure of each embodiment may be added to, deleted from, and replaced with another structure.

What is claimed is:

1. A thin film transistor using a first oxide semiconductor layer as a channel layer, the transistor comprising:
   a substrate, the first oxide semiconductor layer which is formed on the substrate, a gate insulating film which is formed on the first oxide semiconductor layer, a gate electrode which is formed on the gate insulating film;
   a first laminated film which includes a source electrode and a second oxide semiconductor layer, wherein the second oxide semiconductor layer is formed between the source electrode and the first oxide semiconductor layer in a source region; and
   a second laminated film which includes a drain electrode and a third oxide semiconductor layer, wherein the third oxide semiconductor layer is formed between the drain electrode and the first oxide semiconductor layer in a drain region; wherein
   the first oxide semiconductor layer, the second oxide semiconductor layer and the third oxide semiconductor layer include indium and oxygen,
   a content ratio of oxygen to indium (O/In) in each of the second oxide semiconductor layer and the third oxide semiconductor layer is equal to or larger than that of the first oxide semiconductor layer, and
   a film thickness of each of the second oxide semiconductor layer and the third oxide semiconductor layer is thicker than that of the first oxide semiconductor layer.

2. The thin film transistor according to claim 1, wherein: $^{113}$In concentration in the second oxide semiconductor layer and in the third oxide semiconductor layer is 0.1 to 1 times compared with that in the first oxide semiconductor layer, and
$^{115}$In$^{16}$O concentration in the second oxide semiconductor layer and in the third oxide semiconductor layer is 1 to 2 times compared with that in the first oxide semiconductor layer.

3. The thin film transistor according to claim 1, wherein the first, the second and the third oxide semiconductor layers further include Zn or Ga.

4. The thin film transistor according to claim 1, wherein a film thickness of the channel layer is in a range of 5 nm to 50 nm.

5. The thin film transistor according to claim 1, wherein a film thickness of the second oxide semiconductor layer in the source region and a film thickness of the third oxide semiconductor layer in the drain region are in a range of 10 nm to 200 nm.

6. A display device which includes a display unit and a driving circuit unit, the display unit comprising:
   a substrate, a first oxide semiconductor layer which is formed on the substrate, a gate insulating film which is formed on the first oxide semiconductor layer, a gate electrode which is formed on the gate insulating film;
   a first laminated layer which includes a source electrode and a second oxide semiconductor layer, wherein the second oxide semiconductor layer is formed between the source electrode and the first oxide semiconductor layer in a source region; and
   a second laminated layer which includes a drain electrode and a third oxide semiconductor layer, wherein the third oxide semiconductor layer is formed between the drain electrode and the first oxide semiconductor layer in a drain region; wherein
   the first oxide semiconductor layer, the second oxide semiconductor layer and the third oxide semiconductor layer include indium and oxygen,
   a content ratio of oxygen to indium (O/In) in each of the second oxide semiconductor layer and the third oxide semiconductor layer is equal to or larger than that of the first oxide semiconductor layer, and
   a film thickness of each of the second oxide semiconductor layer and the third oxide semiconductor layer is thicker than that of the first oxide semiconductor layer.

7. The display device according to claim 6, wherein the display unit includes a liquid crystal layer, an alignment film, a color filter, and a black matrix layer.

8. The display device according to claim 6, wherein a lower film is disposed between the substrate and the first oxide semiconductor layer.

* * * * *